(12) United States Patent
Ritter

(10) Patent No.: US 10,725,235 B2
(45) Date of Patent: Jul. 28, 2020

(54) LIGHT PIPE ASSEMBLY

(71) Applicant: INTERDIGITAL CE PATENT HOLDINGS, Paris (FR)

(72) Inventor: Darin Bradley Ritter, Indianapolis, IN (US)

(73) Assignee: INTERDIGITAL CE PATENT HOLDINGS, Paris (FR)

( * ) Notice: Subject to any disclaimer, the term of this patent is extended or adjusted under 35 U.S.C. 154(b) by 0 days.

(21) Appl. No.: 16/262,787

(22) Filed: Jan. 30, 2019

(65) Prior Publication Data

US 2019/0235159 A1    Aug. 1, 2019

Related U.S. Application Data

(60) Provisional application No. 62/623,697, filed on Jan. 30, 2018.

(51) Int. Cl.

| F21V 8/00 | (2006.01) |
|---|---|
| G09F 23/00 | (2006.01) |
| G09F 13/04 | (2006.01) |
| G02B 27/09 | (2006.01) |
| H05K 1/02 | (2006.01) |
| H05K 1/18 | (2006.01) |
| H05K 5/02 | (2006.01) |
| G09F 13/22 | (2006.01) |

(52) U.S. Cl.
CPC ....... *G02B 6/0096* (2013.01); *G02B 27/0994* (2013.01); *G09F 13/04* (2013.01); *G09F 23/0058* (2013.01); *H05K 1/0274* (2013.01); *H05K 1/181* (2013.01); *H05K 5/02* (2013.01); *G02B 6/0008* (2013.01); *G09F 2013/049* (2013.01); *G09F 2013/0427* (2013.01); *G09F 2013/222* (2013.01); *H05K 2201/09036* (2013.01); *H05K 2201/10106* (2013.01); *H05K 2201/10121* (2013.01); *H05K 2201/10522* (2013.01)

(58) Field of Classification Search
None
See application file for complete search history.

(56) References Cited

U.S. PATENT DOCUMENTS

| 5,327,328 A * | 7/1994 | Simms ................ G02B 6/0001 362/23.07 |
| 5,760,754 A * | 6/1998 | Amero, Jr. ............. G09F 9/305 345/102 |
| 7,293,904 B2 * | 11/2007 | Beitelspacher ...... G02B 6/0008 362/555 |

FOREIGN PATENT DOCUMENTS

| CN | 107110438 A * | 8/2017 |
| WO | WO 0227697 A2 | 4/2002 |

* cited by examiner

*Primary Examiner* — Britt D Hanley
(74) *Attorney, Agent, or Firm* — Patricia A. Verlangieri

(57) ABSTRACT

An illumination structure for an electronic device is described. The electronic device includes a housing mounted on a printed circuit board. The housing has a plurality of light pipes and at least one separator disposed therein. The at least one separator is positioned between adjacent light pipes of the plurality of light pipes.

16 Claims, 5 Drawing Sheets

LIGHT PIPE ASSEMBLY

REFERENCE TO RELATED APPLICATION

This application claims priority from U.S. Provisional Application No. 62/623,697, entitled "LIGHT PIPE ASSEMBLY", filed Jan. 30, 2018, the contents of which are hereby incorporated by reference in its entirety.

FIELD

The disclosure generally relates to electronic devices and, more specifically, to an electronic device having a light pipe structure for illuminating logos, buttons, and/or indicator signals.

BACKGROUND

Consumer and market preference for electronic devices such as set top boxes, computers, game consoles, DVD players, CD players, etc., is to have such devices include logos, buttons and/or indicator signals which are illuminated. Typically, these electronic devices utilize a unitary light pipe structure to illuminate lenses visible through a faceplate of the device.

The unitary light pipe structure is a single molded part that includes a plurality of individual light pipes. Each of the plurality of light pipes is dedicated for use with a different light emitting element to illuminate one of the lenses. However, for such unitary light pipe structures, light from one light pipe can propagate, bleed or leak to an unintended adjacent light pipe in the unitary structure. This unintended illumination will be referred to as leakage.

This light leakage may be annoying to the user because adjacent lenses which are illuminated by unintended light can provide false information and/or cause the lens at the end of the light pipe that receives the leakage to be non-uniformly illuminated.

The present disclosure is directed toward overcoming one or more of these drawbacks.

SUMMARY

According to a first aspect of the disclosure, an illumination structure for an electronic device is described. The electronic device includes a housing mounted on a printed circuit board. The housing has a plurality of light pipes and at least one separator disposed therein. The at least one separator is positioned between adjacent light pipes of the plurality of light pipes.

In another embodiment, the housing is formed of an opaque material.

In another embodiment, the at least one separator includes a tab on a first end extending through the housing and into a slot in the printed circuit board.

In another embodiment, the length of the tab may be varied based on a width of an input end of a respective light pipe.

In another embodiment, the at least one separator is formed of an opaque material.

In another embodiment, the housing includes at least one of a clip and a retention barb.

In another embodiment, the plurality of light pipes provide illumination to an element visible from the exterior of the housing.

In another embodiment, the plurality of light pipes are arranged to guide illumination from a light source to light lenses mounted on the housing.

In another embodiment, the light source includes two or more light emitting devices mounted on the printed circuit board.

In another embodiment, at least one of the plurality of light pipes has a curved structure.

In another embodiment, a set top box includes the electronic device.

BRIEF DESCRIPTION OF THE DRAWINGS

These and other aspects, features and advantages of the present disclosure will be described or become apparent from the following detailed description of the preferred embodiments, which is to be read in connection with the accompanying drawings.

In the drawings, wherein like reference numerals denote similar elements throughout the views.

It should be understood, that the drawings are for purposes of illustrating the concepts of the disclosure and are not necessarily the only possible configuration for illustrating the disclosure.

DETAILED DESCRIPTION OF PREFERRED EMBODIMENTS

The present description illustrates the principles of the present disclosure. It will thus be appreciated that those skilled in the art will be able to devise various arrangements that although not explicitly described or shown herein, embody the principles of the disclosure and are included within its spirit and scope.

All examples and conditional language recited herein are intended for instructional purposes to aid the reader in understanding the principles of the disclosure and the concepts contributed by the inventor to furthering the art, and are to be construed as being without limitation to such specifically recited examples and conditions.

Moreover, all statements herein reciting principals, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed to perform the same function, regardless of structure.

Figure 1:
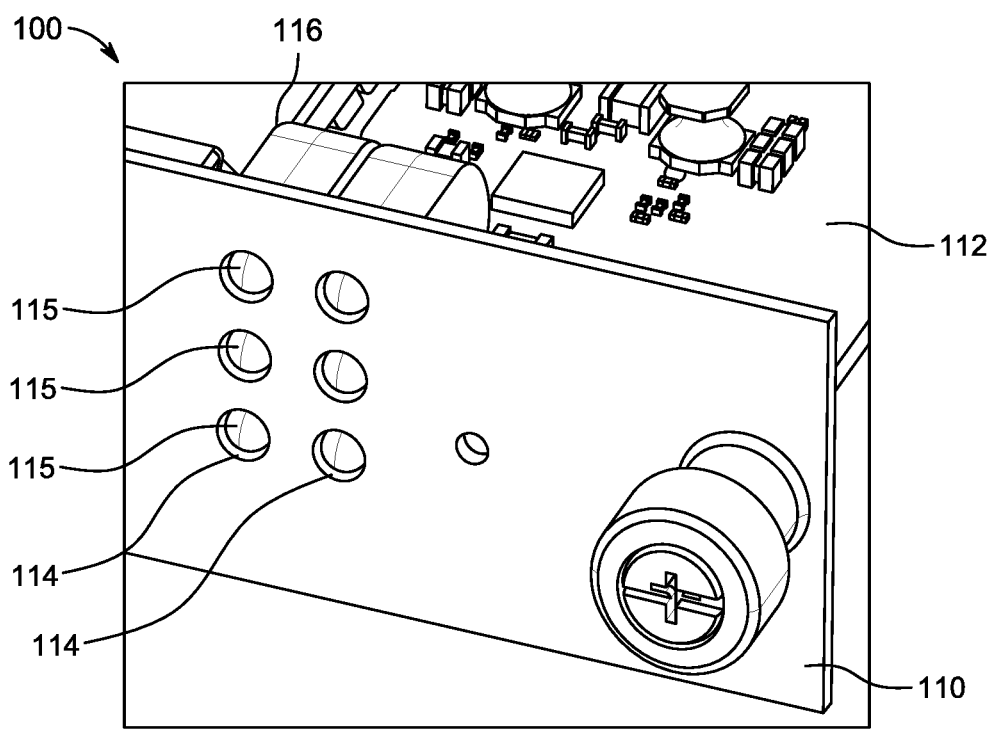
FIG. 1 is a view showing a partial frontal area of a faceplate and printed circuit board of an electronic device of the present disclosure.

FIG. 1 is an illustration of a partial view of an electronic device 100 of the present disclosure. The electronic device 100 may include for example a set top box, a computer, a game console, a DVD player, and a CD player. The electronic device 100 includes at least one printed circuit board 112 and a faceplate 110. The faceplate includes apertures 114 therethrough that are aligned with light pipe lenses 115 from a light pipe structure 116 (partially shown in FIG. 1).

Figure 2:
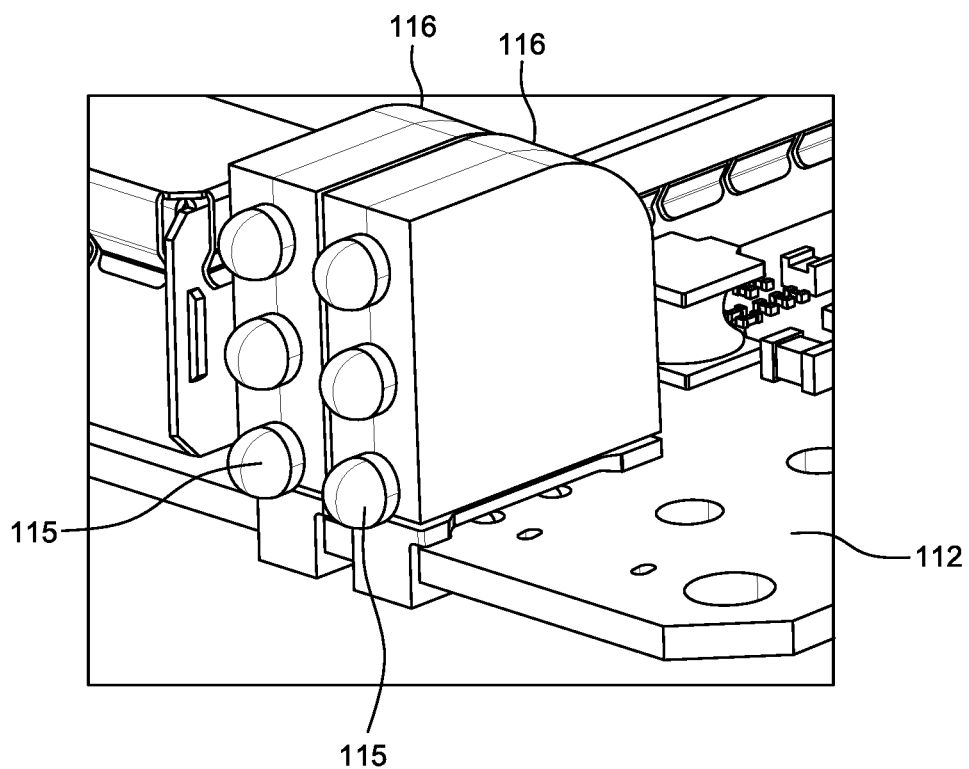
FIG. 2 is a view showing an area of the circuit board of FIG. 1 behind the faceplate depicting two exemplary light pipe structures mounted thereon.

Referring to FIG. 2, there is shown a view of the printed circuit board 112 without the faceplate 110 (not shown). One or more light pipe structures 116 are mounted on the printed circuit board 112. As shown in exemplary FIG. 2, there are two light pipe structures mounted adjacent to each other on an edge of printed circuit board 112. One or more light pipe lenses 115 are shown on one face of each of the light pipe structures 116. The light pipe lenses 115 are aligned with apertures 114 in the faceplate (FIG. 1) when the electronic device is assembled.

Figure 3:
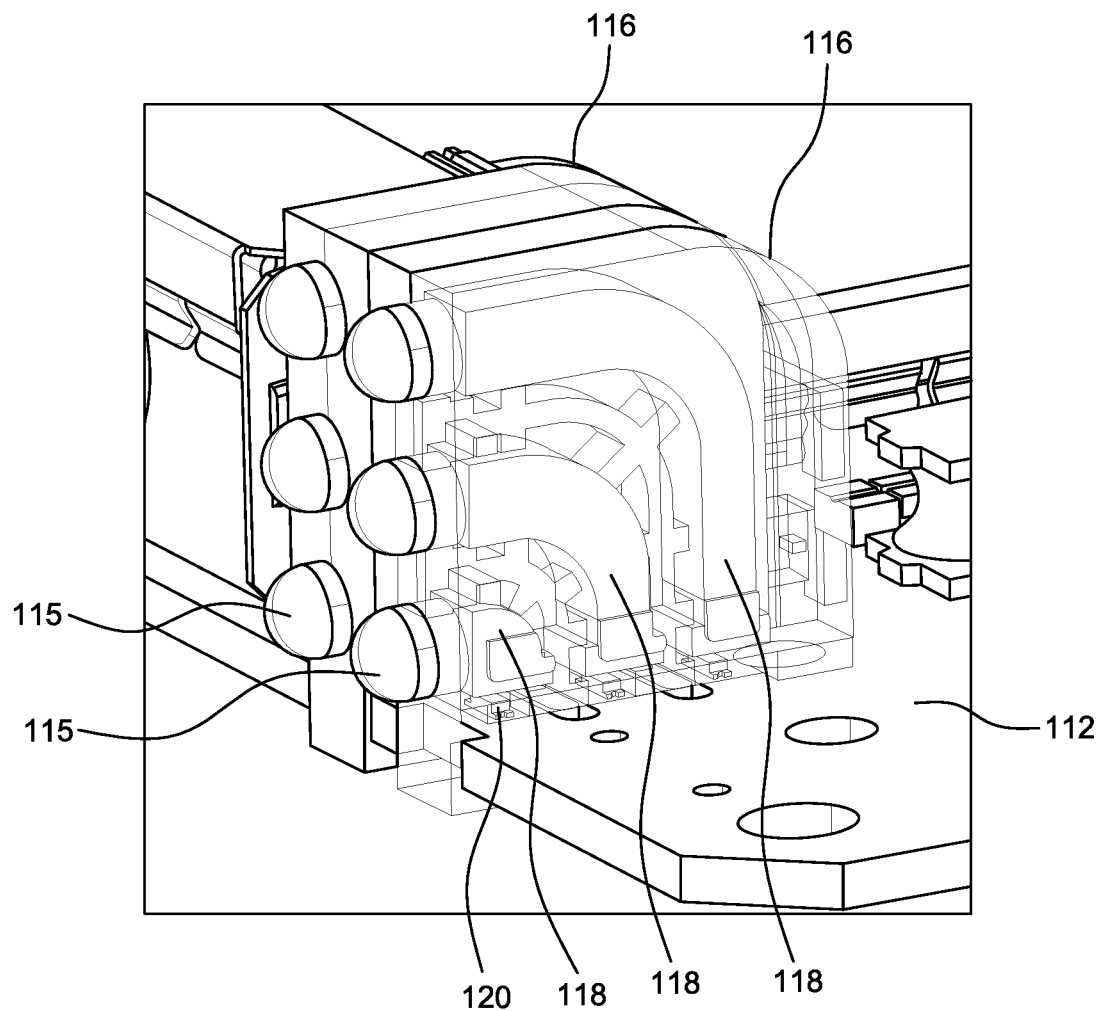
FIG. 3 is a perspective view of the interior of one of the two exemplary light pipe structures mounted on the printed circuit board shown in FIG. 2.

FIG. 3 is a view of the interior of one of the light pipe structures 116 mounted on the printed circuit board 112 shown in FIG. 2. The light pipe structure 116 includes one or more light pipes 118. Each light pipe 118 is coupled at its output to a light pipe lens 115. A light emitting device 120 that is mounted on the printed circuit board 112 is coupled to the input of each light pipe 118.

Figure 4:
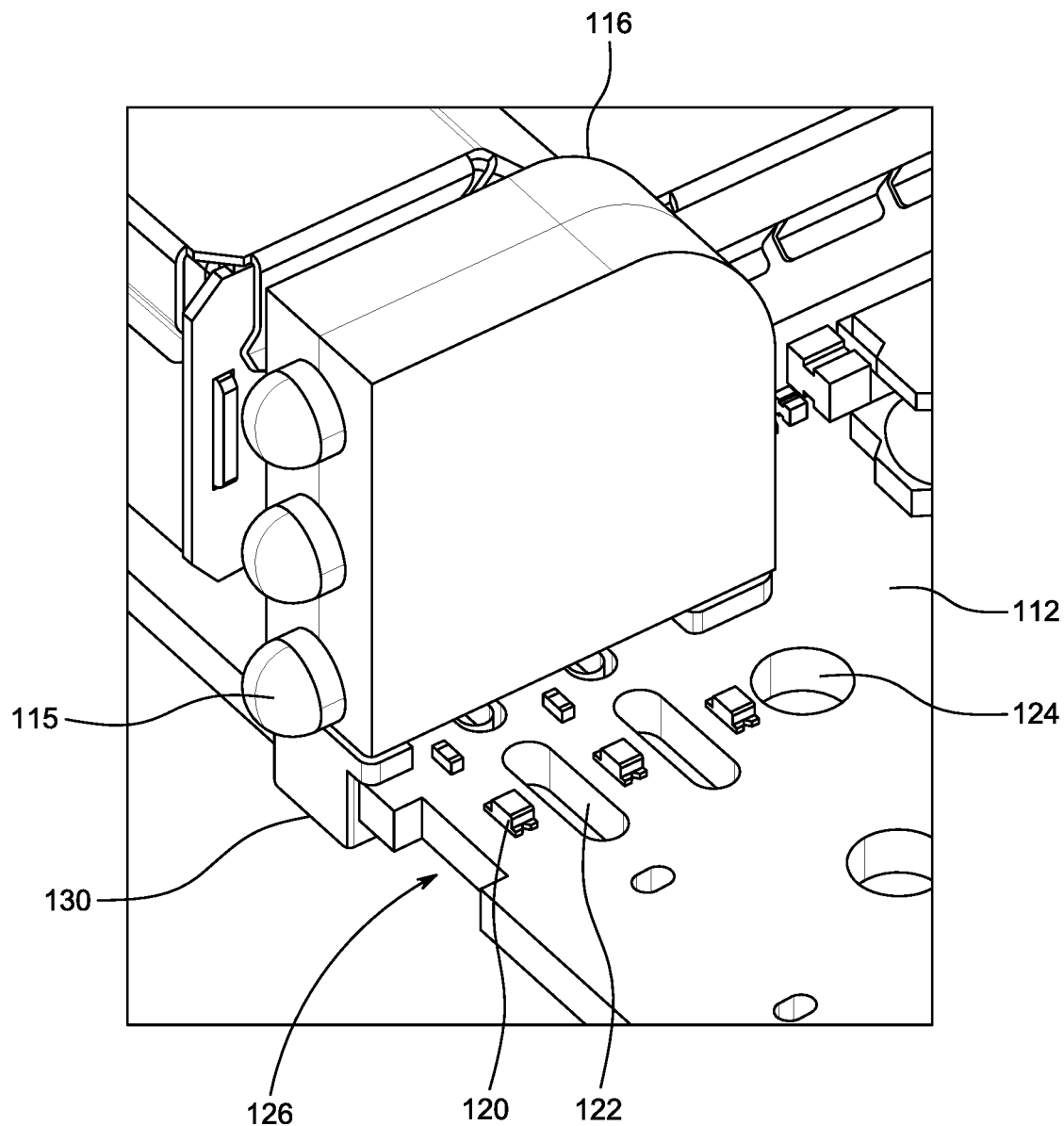
FIG. 4 is a perspective top view of the printed circuit board on which the light pipe structure is mounted.

FIG. 4 is a top view of the printed circuit board 112 on which the light pipe structure 116 is mounted. Light emitting devices 120 are mounted on the printed circuit board 112. The light emitting device may be for example a light emitting diode (LED). The light from each of the light emitting devices is 120 coupled to a light pipe 118 (not shown) of the light pipe structure 116 mounted thereover.

Additionally, with reference to FIG. 4 there are shown isolation slots 122, which are positioned between the light emitting devices 120. At least one retention feedthrough 124 is positioned behind the last light emitting device 120 and is used for mounting the light pipe structure 116 to the printed circuit board 112. A notch 126 on a front end of the printed circuit board 116 is also used to mount the light pipe structure 116 thereto.

Figure 5:
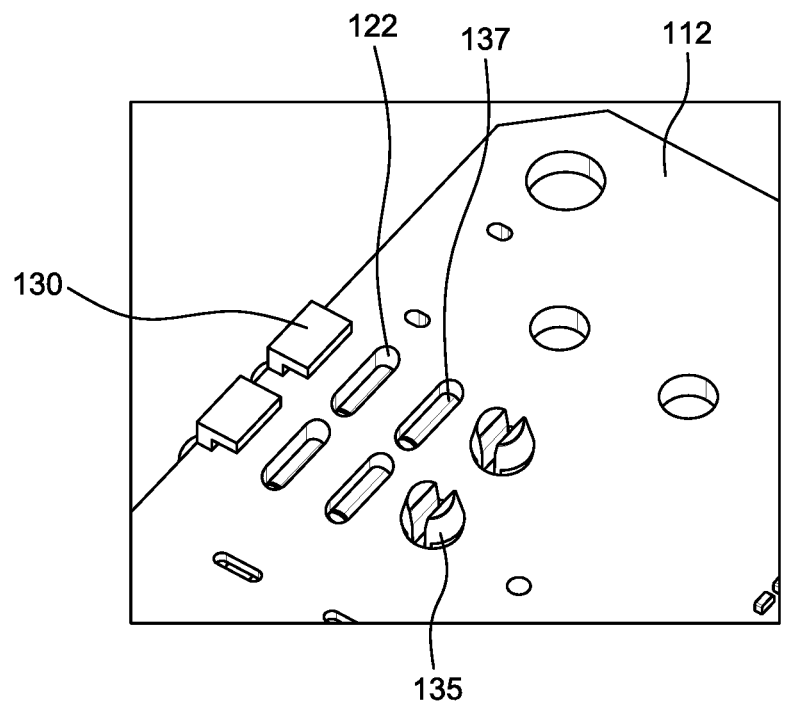
FIG. 5 is a bottom view of the printed circuit board on which the light pipe structure is mounted.

FIG. 5 is a bottom view of the printed circuit board 112 on which the light pipe structure (not shown) is mounted. In FIG. 5, the light pipe structure 116 is mounted on the printed circuit board 112. A clip 130 at the front end of the light pipe structure 116 is attached at the notch 126 (FIG. 4) and a retention barb 135 at a back end of the light pipe structure 116 is inserted through feedthrough 124 (FIG. 4) to mount the light pipe structure on the printed circuit board 116.

Figure 6:
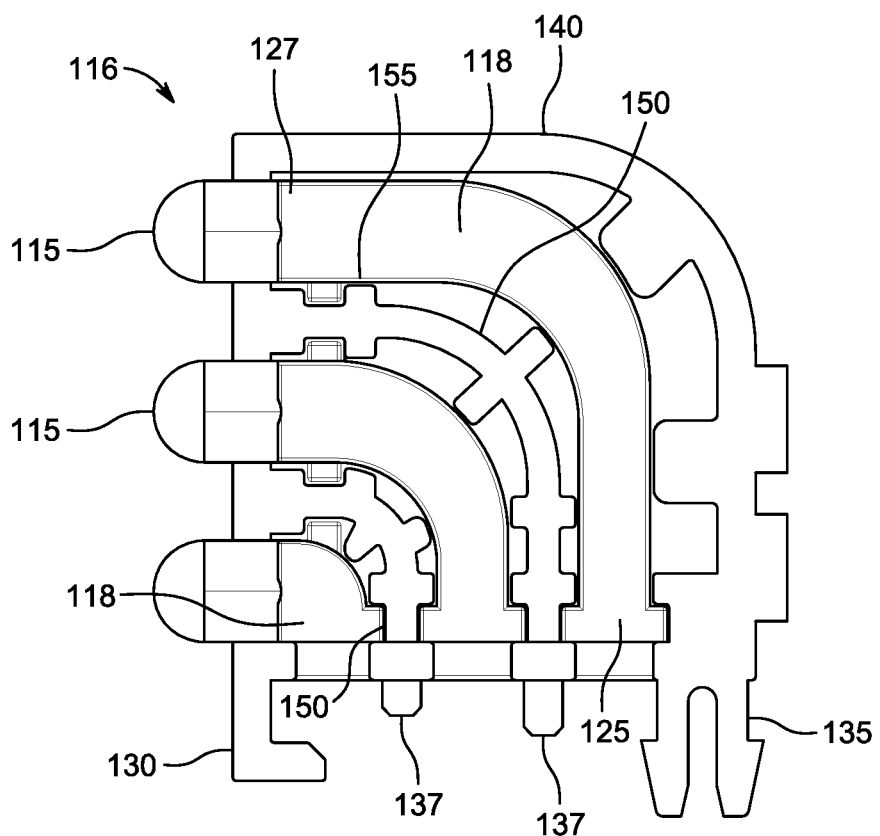
FIG. 6 is a cross-sectional view of an exemplary light pipe structure shown in FIG. 2.

FIG. 6 is a cross-sectional view of the exemplary light pipe structure 116 shown in FIG. 2. The light pipe structure includes a housing 140, one or more light pipes 118 and separators 150. The housing 140 is an enclosure within which are positioned the light pipes 118 and the separators 150. The housing 140 may be formed for example of an opaque plastic material.

The one or more light pipes 118 are positioned within the housing and have an input end 125 and an output end 127. The input end 125 is positioned adjacent to an opening in the housing 140 to be positioned over a light emitting device 120 positioned on the printed circuit board 112 (FIG. 4). The output end 127 is positioned abutting a lens 115 that is positioned in an aperture 114 in the faceplate 110 (FIG. 1). The exemplary light pipes 118 depicted in FIG. 6 have a curved structure. However, other structures are also contemplated such as for example linear or angled structures (not shown). The light pipes 118 are formed of a solid transparent or translucent material that transmits light.

The light pipes 118 are separated one from the other with separators 150 within the housing, as shown in FIG. 6. The separators 150 surround the light pipes 118 such that light does not leak within the housing from one light pipe 118 to another. The separators may be formed of an opaque plastic material. The separators may have ribs 155 attached thereto to facilitate holding the light pipes in fixed positions within the housing.

Referring to FIG. 6, the separators 150 have tabs 137 that extend through the housing and are positioned between openings in the housing 140. The openings allow light emitted by the light emitting devices 120 to enter the input end 125 of the light pipes 118. The tabs 137 are inserted in the slots 122 (FIG. 4) of the printed circuit board 112 when the light pipe structure 116 is mounted thereto. The tabs 137 extending through the housing 140 and into the slots 122 in the printed circuit board 112 reduces the leakage of light from the light emitting devices 120 to adjacent light pipes 118. Additionally, the length of the tabs 137 extending through the housing 140 may be varied according to the width of the input end 125 of the one or more light pipes 118 to facilitate reducing the leakage of light from the light emitting devices 120 to adjacent light pipes 118.

The housing 140 includes a retention barb 135 and a clip 130 which are used to facilitate mounting the light pipe structure 116 on the printed circuit board. The clip 130 is aligned with notch 126 (FIG. 4) on the printed circuit board. The retention barb 135 is inserted into feedthrough 124 (FIG. 4) on the printed circuit board 112.

Figure 7:
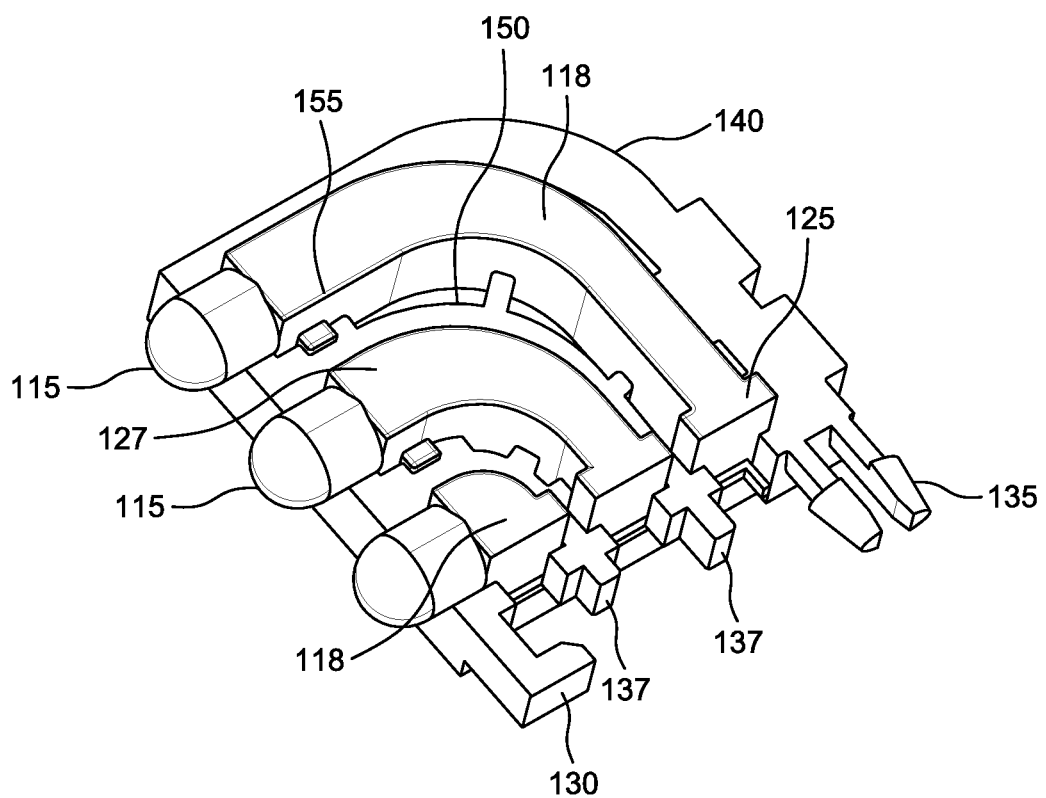
FIG. 7 is a perspective view of the cross-section of the light pipe structure shown in FIG. 6.

FIG. 7 is a perspective view of the cross-section of the light pipe structure shown in FIG. 6.

The invention claimed is:

1. An electronic device, comprising:
   a housing mounted on a printed circuit board,
   wherein the housing includes a plurality of light pipes and at least one separator, wherein the at least one separator is positioned between two light pipes of the plurality of light pipes; and
   wherein the at least one separator includes a tab on a first end extending through the housing and into a slot in the printed circuit board, wherein a length of the tab is varied based on a width of an input end for a respective light pipe.

2. The electronic device of claim 1, wherein the housing is formed of an opaque material.

3. The electronic device of claim 1, wherein the at least one separator is formed of an opaque material.

4. The electronic device of claim 1, wherein the housing includes at least one of a clip and a retention barb.

5. The electronic device of claim 1, wherein the plurality of light pipes provide illumination to an element visible from the exterior of the housing.

6. The electronic device of claim 1, wherein the plurality of light pipes are arranged to guide illumination from a light source to lenses mounted on the housing.

7. The electronic device of claim 6, wherein the light source comprises two or more light emitting devices mounted on the printed circuit board.

8. The electronic device of claim 1, wherein at least one of the plurality of light pipes has a curved structure.

9. A set top box, comprising:
   a housing mounted on a printed circuit board,
   wherein the housing includes a plurality of light pipes and at least one separator, wherein the at least one separator is positioned between two light pipes of the plurality of light pipes; and
   wherein the at least one separator includes a tab on a first end extending through the housing and into a slot in the printed circuit board, wherein a length of the tab is varied based on a width of an input end for a respective light pipe.

10. The set top box of claim 9, wherein the housing is formed of an opaque material.

11. The set top box of claim 9, wherein the at least one separator is formed of an opaque material.

12. The set top box of claim 9, wherein the housing includes at least one of a clip and a retention barb.

13. The set top box of claim 9, wherein the plurality of light pipes provide illumination to an element visible from the exterior of the housing.

14. The set top box of claim 9, wherein the plurality of light pipes are arranged to guide illumination from a light source to lenses mounted on the housing.

15. The set top box of claim 14, wherein the light source comprises two or more light emitting devices mounted on the printed circuit board.

16. The set top box of claim 9, wherein at least one of the plurality of light pipes has a curved structure.

* * * * *